United States Patent
Huang et al.

(10) Patent No.: US 12,356,872 B2
(45) Date of Patent: Jul. 8, 2025

(54) HEAT SHIELD AND JOSEPHSON JUNCTION ARRAY CHIP SYSTEM

(71) Applicant: STATE GRID JIANGSU ELECTRIC POWER CO., LTD. MARKETING CENTER, Jiangsu (CN)

(72) Inventors: Qifeng Huang, Jiangsu (CN); Qing Xu, Jiangsu (CN); Siyun Wang, Jiangsu (CN); Zhixin Li, Jiangsu (CN); Xiao Chen, Jiangsu (CN); Zhongdong Wang, Jiangsu (CN); Mingming Chen, Jiangsu (CN); Yongxian Yi, Jiangsu (CN); Guofang Xia, Jiangsu (CN); Jin Bao, Jiangsu (CN)

(73) Assignee: State Grid Jiangsu Electric Power Co., Ltd. Marketing Center, Nanjing (CN)

( * ) Notice: Subject to any disclaimer, the term of this patent is extended or adjusted under 35 U.S.C. 154(b) by 0 days.

(21) Appl. No.: 18/955,851

(22) Filed: Nov. 21, 2024

(65) Prior Publication Data
US 2025/0127066 A1    Apr. 17, 2025

Related U.S. Application Data

(63) Continuation of application No. PCT/CN2024/119913, filed on Sep. 20, 2024.

(30) Foreign Application Priority Data

Oct. 12, 2023   (CN) .......................... 202311315251.4

(51) Int. Cl.
*H10N 60/00*    (2023.01)
*H10N 60/12*    (2023.01)
*H10N 69/00*    (2023.01)

(52) U.S. Cl.
CPC ............. *H10N 69/00* (2023.02); *H10N 60/12* (2023.02)

(58) Field of Classification Search
CPC ............................... H10N 60/00; H10N 60/12
See application file for complete search history.

(56) References Cited

U.S. PATENT DOCUMENTS

| | | |
|---|---|---|
| 2012/0252678 A1 | 10/2012 | Kim et al. |
| 2020/0373475 A1 | 11/2020 | Rufenacht et al. |
| | (Continued) | |

FOREIGN PATENT DOCUMENTS

| | | |
|---|---|---|
| CN | 104377299 A | 2/2015 |
| CN | 206725103 U | 12/2017 |
| | (Continued) | |

OTHER PUBLICATIONS

English Abstract; Wang Zeng-min et al.; National Institute of Metrology, Beijing; vol. 44, No. 9, Sep. 2023; Research on Cryocooled Programmable Josephson Voltage Standard and Its Cryostat.
(Continued)

*Primary Examiner* — Paul A Wartalowicz
(74) *Attorney, Agent, or Firm* — ArentFox Schiff LLP

(57) ABSTRACT

Provided are a heat shield and a Josephson junction array chip system, the heat shield includes a cryostat, a sensor group, a radiation shield plate, a clamp assembly, and a vacuum shield cover assembly; the cryostat includes a cold head, a first-stage chassis, and a second-stage chassis; the vacuum shield cover assembly includes a first vacuum shield cover, a second vacuum shield cover, and a heat shield aluminum oxide layer; and the cold head is located in the first vacuum shield cover; and the heat shield aluminum oxide layer is coated on a surface of at least one of the first vacuum shield cover or the second vacuum shield cover; the clamp assembly on the radiation shield plate is configured to
(Continued)

fix the Josephson junction array chip; and the sensor group adjacent to the Josephson junction array chip is arranged on the radiation shield plate.

18 Claims, 5 Drawing Sheets

(56) References Cited

U.S. PATENT DOCUMENTS

2023/0160630 A1    5/2023   Kodama et al.
2025/0004222 A1*   1/2025   Choudhury .......... G02B 6/4279

FOREIGN PATENT DOCUMENTS

CN    112547153 A    3/2021
CN    117062515 A    11/2023

OTHER PUBLICATIONS

English Abstract; Wang Zeng-min et al.; National Institute of Metrology, Beijing; vol. 49, No. 2, 636-643; Feb. 28, 2023; Thermal Characteristics of Liquid Helium Free Josephson Voltage Standards.
International Search Report dated Dec. 26, 2024 from corresponding PCT Application No. PCT/CN2024/119913.

* cited by examiner

HEAT SHIELD AND JOSEPHSON JUNCTION ARRAY CHIP SYSTEM

CROSS-REFERENCE TO RELATED APPLICATIONS

This is a continuation of International Patent Application No. PCT/CN2024/119913, filed on Sep. 20, 2024, which claims priority to Chinese Patent Application No. 202311315251.4 filed with the China National Intellectual Property Administration (CNIPA) on Oct. 12, 2023, the disclosures of both of which are incorporated herein by reference in their entireties.

TECHNICAL FIELD

The present application belongs to the field of chip heat shield and, for example, relates to a heat shield and a Josephson junction array chip system.

BACKGROUND

A Josephson junction is a kind of superconducting tunnel junction and has great superconducting properties under predetermined conditions. A Josephson junction array chip formed by Josephson junctions needs to remain in the superconducting state to realize the normal operation of the chip. To maintain the superconducting state of the Josephson junction array chip, the Josephson junction array chip needs to work at a temperature of 4 K. In the related art, the temperature adjustment of the Josephson junction array chip may be achieved only by cooling the Josephson junction array chip through a cold source. However, in the working process of the Josephson junction array chip, the heat radiation in the environment and wires between the Josephson junction array chip and other devices may also transfer heat to the Josephson junction array chip, and thus, the actual operating temperature of the Josephson junction array chip is higher than 4 K, which is not beneficial to maintain the superconducting state of the Josephson junction array chip. For example, the patent CN104377299A discloses a superconducting quantum interference device (SQUID) structure that prevents magnetic field interference in a non-magnetic shielding environment. An annular superconductive wall is manufactured around the Josephson junction, the superconductive wall surrounds the Josephson junction and achieves a micromagnetic shielding function, and accordingly, interference of an applied magnetic field on the Josephson junction is suppressed. The height of the superconductive wall is much larger than the thickness of an insulating layer of the Josephson junction. Although the superconductive wall based on a superconductive film material is manufactured around the Josephson junction serving as the core structure of the SQUID and the annular superconductive wall can effectively shield the applied magnetic field from entering the Josephson junction, the heat shield for the Josephson junction cannot be achieved.

SUMMARY

The present application provides a heat shield and a Josephson junction array chip system which can achieve the heat shield for the Josephson junction array chip and reduce net radiation transfer.

In a first aspect, the present application provides a heat shield. The heat shield includes a cryostat, a sensor group, a radiation shield plate, a clamp assembly, and a vacuum shield cover assembly.

The cryostat includes a cold head, a first-stage chassis, and a second-stage chassis that are arranged at intervals in sequence.

The vacuum shield cover assembly includes a first vacuum shield cover and a second vacuum shield cover. The second vacuum shield cover is fixed to the second-stage chassis, the first vacuum shield cover is fixed to the first-stage chassis and is located in the second vacuum shield cover, and the cold head is located in the first vacuum shield cover. The vacuum shield cover assembly further includes a heat shield aluminum oxide layer. The heat shield aluminum oxide layer is coated on the surface of the first vacuum shield cover and/or the second vacuum shield cover.

The radiation shield plate is fixed on the cold head.

A waveguide assembly is connected to an antenna of a Josephson junction array chip. The waveguide assembly includes a rigid waveguide and a flexible waveguide connected to the rigid waveguide. The rigid waveguide is located in the first vacuum shield cover, and the flexible waveguide extends outside the second vacuum shield cover.

The clamp assembly is arranged on the radiation shield plate and fixes the Josephson junction array chip.

The sensor group is arranged on the radiation shield plate and is configured to be adjacent to the Josephson junction array chip.

In some embodiments, the cryostat further includes a cryostat body. The cold head is disposed at an end of the cryostat body, and the first-stage chassis and the second-stage chassis are arranged apart along an axial direction on the sidewall of the cryostat body.

In some embodiments, the clamp assembly includes a clamp cover plate, a chip base, and a chip finger-jointed plate. The chip base is fixed on the radiation shield plate. The chip finger-jointed plate is fixed on the chip base. The chip finger-jointed plate and the clamp cover plate enclose to fix the Josephson junction array chip.

In some embodiments, the chip finger-jointed plate includes a flame-resistant substrate and a copper-beryllium alloy finger-jointed plate. The flame-resistant substrate is fixed on the chip base. The copper-beryllium alloy finger-jointed plate is arranged on the flame-resistant substrate and is connected to the Josephson junction array chip.

In some embodiments, a connector is fixed on the second vacuum shield cover, and the connector is connected to the copper-beryllium alloy finger-jointed plate through a copper wire. The copper wire passes through the first-stage chassis and is fixed on the cryostat body.

In some embodiments, the heat shield further includes a vacuumizing base, a vacuumizing device, and a vacuumizing cover body. The cryostat is fixed in the vacuumizing base. The vacuumizing cover body is sleeved outside the second vacuum shield cover and is detachably fixed to the vacuumizing base in a sealing manner.

The first-stage chassis and the second-stage chassis are each provided with multiple vacuum holes therethrough to enable the internal shield space of the first vacuum shield cover and the internal shield space of the second vacuum shield cover to communicate with the internal space of the vacuumizing cover body. The vacuumizing device is fixedly connected to the vacuumizing base to vacuumize the internal shield spaces and the internal space.

In some embodiments, the first vacuum shield cover and the second vacuum shield cover have the same material and the same thickness, and the heat shield aluminum oxide layer coated on the first vacuum shield cover and the heat shield aluminum oxide layer coated on the second vacuum shield cover have the same thickness.

The thickness of each heat shield aluminum oxide layer is determined in the following manner.

A temperature difference between the inside side of the heat shield aluminum oxide layer and the outside side of the heat shield aluminum oxide layer is obtained according to a physical parameter of the vacuumizing cover body, a physical parameter of the vacuum shield cover assembly, and an ambient temperature outside the heat shield, and the thickness of each heat shield aluminum oxide layer is obtained according to the temperature difference between the inside side of the heat shield aluminum oxide layer and the outside side of the heat shield aluminum oxide layer and a physical parameter of the heat shield aluminum oxide layer.

In some embodiments, the physical parameter of the vacuumizing cover body includes a heat transfer coefficient of the outer side surface of the vacuumizing cover body and a thermal conductivity coefficient, a thickness, and a heat flux density of the vacuumizing cover body, the physical parameter of the vacuum shield cover assembly includes a thermal conductivity coefficient, a thickness, and a heat flux density, and the physical parameter of the heat shield aluminum oxide layer includes the number of heat shield aluminum oxide layers, a thermal conductivity coefficient, and a heat flux density.

In some embodiments, the thickness of each heat shield aluminum oxide layer is determined in the following manner.

A first temperature difference between the ambient temperature and the outer side surface of the vacuumizing cover body is obtained according to the heat transfer coefficient of the outer side surface of the vacuumizing cover body and the heat flux density of the vacuumizing cover body.

A second temperature difference between the outer side surface of the vacuumizing cover body and the inner side surface of the vacuumizing cover body is obtained according to the thermal conductivity coefficient, the thickness, and the heat flux density of the vacuumizing cover body.

A third temperature difference between the outer side surface of the first vacuum shield cover and the inner side surface of the first vacuum shield cover and a fourth temperature difference between the outer side surface of the second vacuum shield cover and the inner side surface of the second vacuum shield cover are obtained according to the thermal conductivity coefficient, the thickness, and the heat flux density of the first vacuum shield cover and the thermal conductivity coefficient, the thickness, and the heat flux density of the second vacuum shield cover.

A fifth temperature difference between the outer side surface of the heat shield aluminum oxide layer and the inner side surface of the heat shield aluminum oxide layer is obtained according to the first temperature difference, the second temperature difference, the third temperature difference, and the fourth temperature difference.

The thickness of each heat shield aluminum oxide layer is obtained according to the fifth temperature difference between the outer side surface of the heat shield aluminum oxide layer and the inner side surface of the heat shield aluminum oxide layer and the number of heat shield aluminum oxide layers, and the thermal conductivity coefficient and the heat flux density of the heat shield aluminum oxide layer.

In some embodiments, the thickness of each heat shield aluminum oxide layer is determined in the following manner:

$$d_3 = \frac{\beta_3(T_1 - T_0)}{m\alpha_3} - \frac{\beta_3\alpha_1}{\gamma m\alpha_3} - \frac{\beta_3}{m\alpha_3}\left(\frac{d_1\alpha_1}{\beta_1} + \frac{2d_2\alpha_2}{\beta_2}\right).$$

In the above formula, $T_1$ is the ambient temperature outside the heat shield, $T_0$ is a critical temperature of the Josephson junction array chip, $d_1$ is the thickness of the vacuumizing cover body, $d_2$ is the thickness of the first vacuum shield cover or the thickness of the second vacuum shield cover, $d_3$ is the thickness of the heat shield aluminum oxide layer, m is the number of heat shield aluminum oxide layers, $\alpha_1$, $\alpha_2$, and $\alpha_3$ are the heat flux density of the vacuumizing cover body, the heat flux density of the vacuum shield cover assembly (the first vacuum shield cover or the second vacuum shield cover), and the heat flux density of the heat shield aluminum oxide layer, respectively, $\beta_1$, $\beta_2$, and $\beta_3$ are the thermal conductivity coefficient of the vacuumizing cover body, the thermal conductivity coefficient of the vacuum shield cover assembly (the first vacuum shield cover or the second vacuum shield cover), and the thermal conductivity coefficient of the heat shield aluminum oxide layer, respectively, and $\gamma$ is the heat transfer coefficient of the outer side surface of the vacuumizing cover body.

In some embodiments, the sensor group includes a temperature sensor and a magnetic field sensor. Both the temperature sensor and the magnetic field sensor are connected to the connector through sensor cables. The sensor cables pass through the first-stage chassis and are fixed on the cryostat body.

In some embodiments, the rigid waveguide is fixed to the flame-resistant substrate and is connected to the antenna of the Josephson junction array chip through the copper-beryllium alloy finger-jointed plate, a first end of the flexible waveguide is connected to the rigid waveguide, and a second end of the flexible waveguide passes through the first-stage chassis and extends outside the second vacuum shield cover.

In some embodiments, the thickness of each vacuum shield cover is made of aluminum and has a thickness of 13 mm to 20 mm, optionally 15 mm.

In some embodiments, the material of the radiation shield plate is oxygen-free high conductivity thermal (OFHC) copper.

In some embodiments, the radiation shield plate is fixed on the cold head through multiple copper pillars.

In some embodiments, the heat shield further includes a current supply assembly. The current supply assembly is connected to the Josephson junction array chip through the connector and a copper wire to supply a bias current to the Josephson junction array chip.

In some embodiments, the heat shield further includes a voltage detection assembly. The voltage detection assembly is connected to the Josephson junction array chip through the connector and a copper wire to detect the voltage of the Josephson junction array chip.

In a second aspect, the present application further provides a Josephson junction array chip system.

The Josephson junction array chip system includes the heat shield described above and the Josephson junction array chip.

The Josephson junction array chip is fixed in the clamp assembly of the heat shield.

In some embodiments, the temperature of the surface of the first vacuum shield cover is 40 K to 46 K when the Josephson junction array chip operates.

In some embodiments, the operating temperature of the Josephson junction array chip is 4 K.

Reference numbers: 1. cryostat; 11. cold head; 12. first-stage chassis; 13. second-stage chassis; 14. cryostat body; 2. clamp assembly; 3. vacuum shield cover assembly; 31. first vacuum shield cover; 32. second vacuum shield cover; 41. vacuumizing base; 42. vacuumizing cover body; 5. sensor group; 6. radiation shield plate; 7. waveguide assembly; 8. heat shield aluminum oxide layer; 9. Josephson junction array chip; 71. rigid waveguide; 72. flexible waveguide; 21. clamp cover plate; 22. chip base; 23. chip finger-jointed plate; 231. flame-resistant substrate; 232. copper-beryllium alloy finger-jointed plate; 33. connector; 43. vacuumizing connection valve.

DETAILED DESCRIPTION

The present application will be described below in detail in conjunction with the drawings. The embodiments described below are part, not all, of the embodiments of the present application. Based on the embodiments in the present application, all other embodiments obtained by those of ordinary skill in the art without creative work are within the scope of the present application.

Terms used in the embodiments of the present application are intended only to describe embodiments and not to limit the present application. Unless otherwise expressly indicated by the context, singular forms "a", "an" and "the" used in the embodiments of the present application and the appended claims are intended to include plural forms, and "multiple" or "plurality of" generally contains at least two.

It is to be noted that the term "comprise", "include" or any other variant thereof is intended to encompass a non-exclusive inclusion so that an article or device that includes a series of elements not only includes those elements but also includes other elements that are not expressly listed or are inherent to such an article or device. In the absence of more restrictions, the elements defined by the statement "comprising a . . . " or "including a . . . " do not exclude the presence of additional identical elements in the article or device that includes the elements.

Embodiments of the present application will be described in detail below with reference to the drawings.

A completely assembled heat shield is capable of cooling the cold shield space of a cryostat in the range of 3.5 K to 4.2 K, depending on the heat load of the heat shield. The goal of the heat shield is to supply a Josephson junction array chip with the optimal operating temperature at which the Josephson junction array chip can produce great superconducting properties. To cool the Josephson junction array chip to the operating temperature, an effective heat conduction path is required between the Josephson junction array chip and the cold head of the cryostat.

Figure 1:
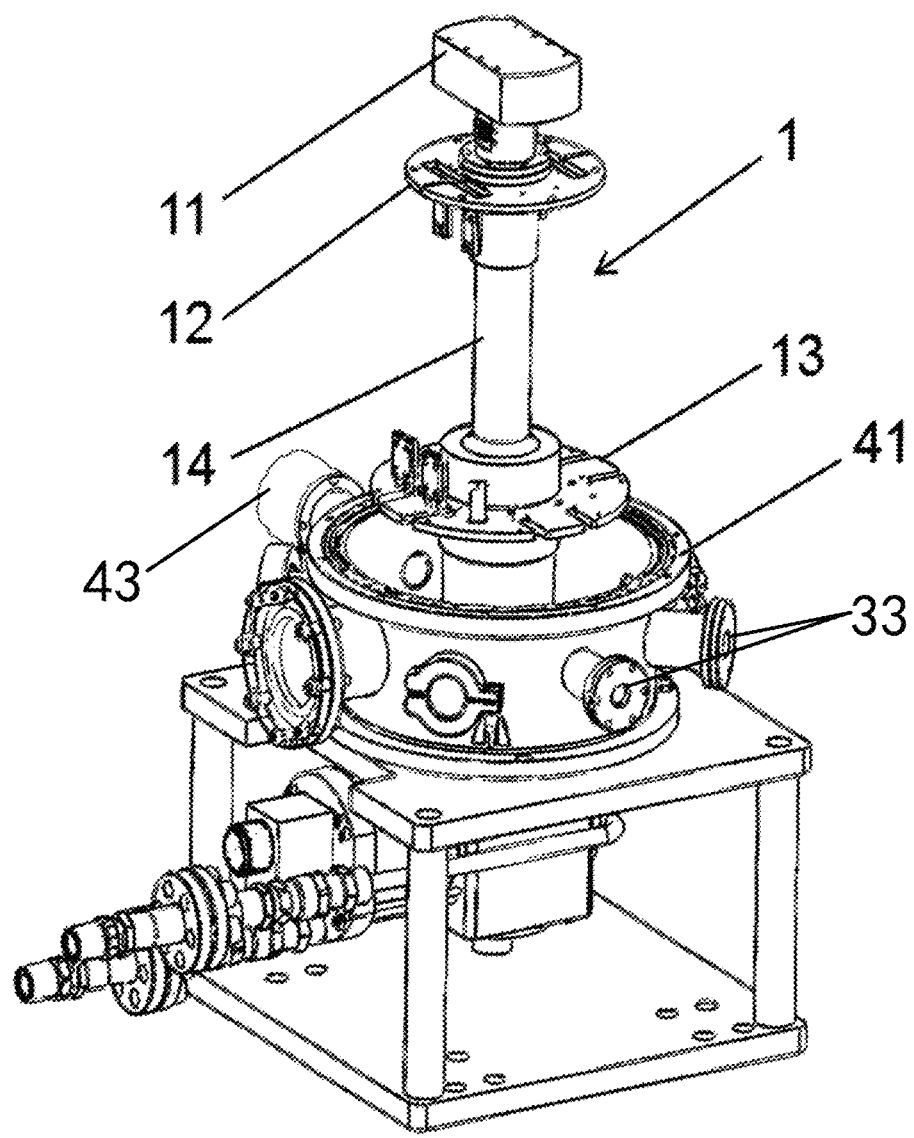
FIG. 1 is a partial structure view illustrating a heat shield according to an embodiment of the present application.
Figure 2:
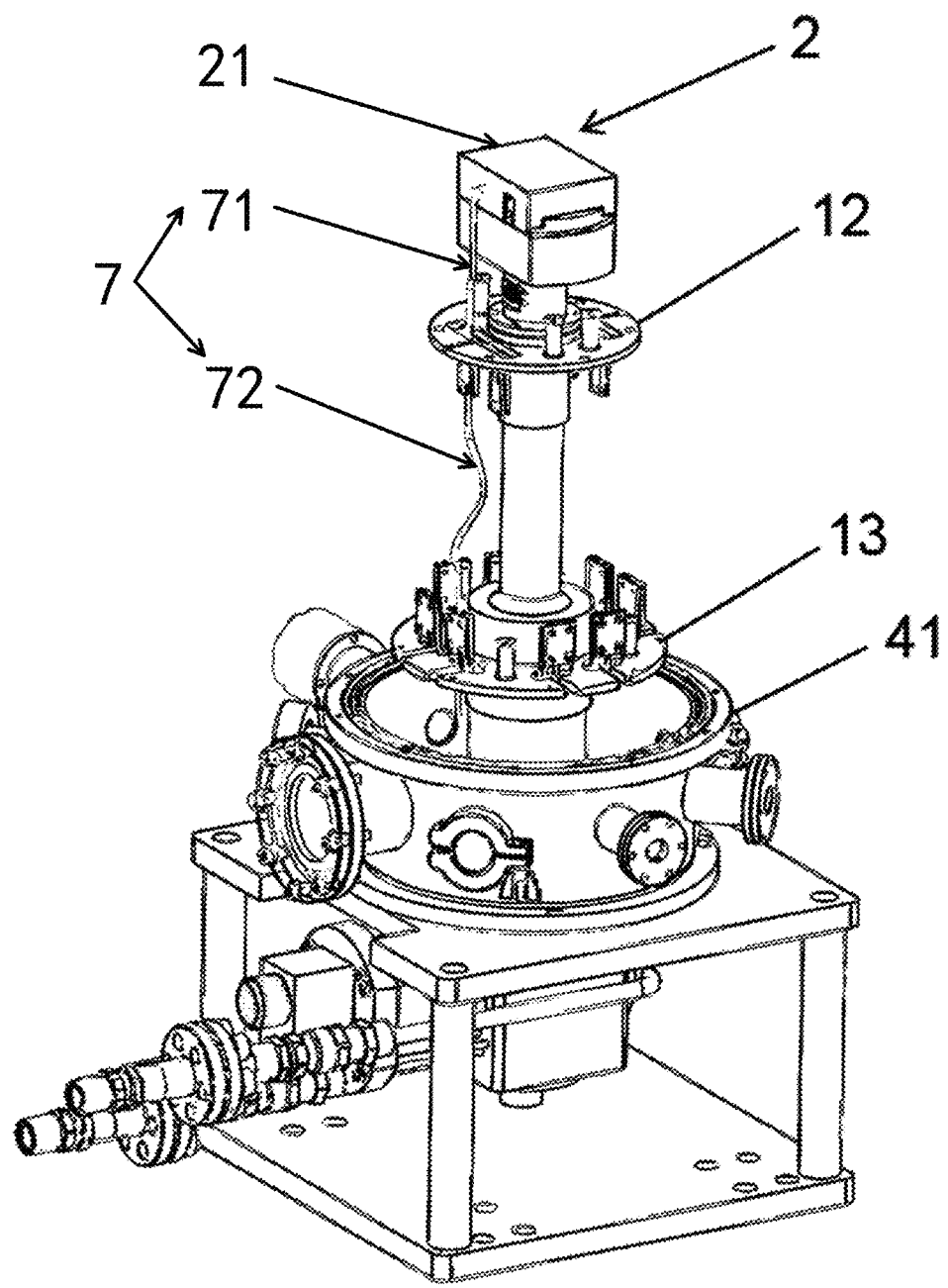
FIG. 2 is a partial structure view illustrating a heat shield with a Josephson junction array chip fixed thereon according to an embodiment of the present application.
Figure 3:
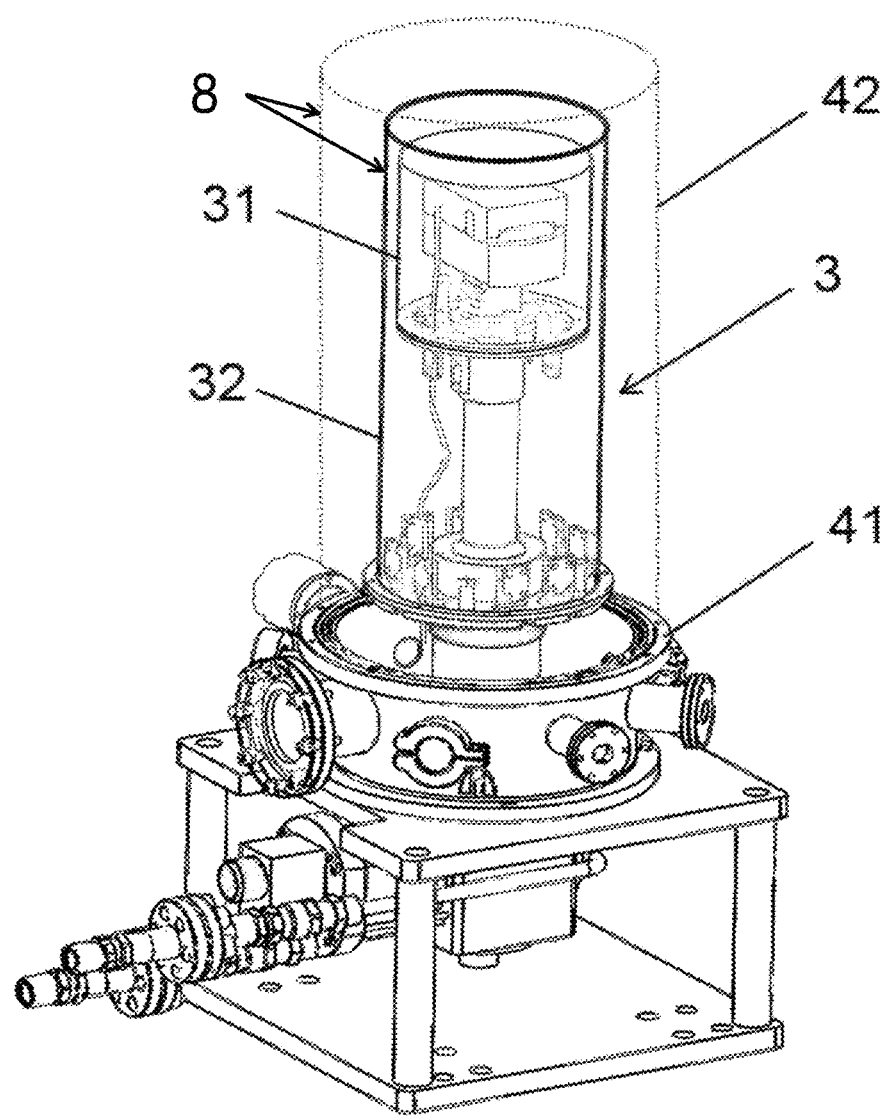
FIG. 3 is a schematic view illustrating a heat shield with a Josephson junction array chip fixed thereon according to an embodiment of the present application.

As shown in FIGS. 1 to 3, the present application provides a heat shield for a Josephson junction array chip. The heat shield may include a cryostat 1, a sensor group 5, a radiation shield plate 6, a clamp assembly 2, and a vacuum shield cover assembly 3.

The cryostat 1 includes a cold head 11, a first-stage chassis 12, and a second-stage chassis 13 that are arranged at intervals in sequence.

The vacuum shield cover assembly 3 includes a first vacuum shield cover 31 and a second vacuum shield cover 32. The second vacuum shield cover 32 is fixed to the second-stage chassis 13, the first vacuum shield cover 31 is fixed to the first-stage chassis 12 and is located in the second vacuum shield cover 32, and the cold head 11 is located in the first vacuum shield cover 31. The vacuum shield cover assembly 3 further includes a heat shield aluminum oxide layer 8. The heat shield aluminum oxide layer 8 is coated on the surface of the first vacuum shield cover 31 and/or the second vacuum shield cover 32.

The radiation shield plate 6 is fixed on the cold head 11.

The clamp assembly 2 is arranged on the radiation shield plate 6 and fixes the Josephson junction array chip 9 (shown in FIG. 2).

The sensor group 5 is arranged near the Josephson junction array chip 9 and on the radiation shield plate 6.

The Josephson junction array chip 9 of the present application is fixed on the radiation shield plate 6 through the clamp assembly 2, and the heat shielding for the Josephson junction array chip 9 is achieved through the cooperation between the radiation shield plate 6 and the vacuum shield cover assembly 3. The material of the radiation shield plate 6 is OFHC copper, and such a material has high thermal conductivity and can transfer the low temperature of the cold head 11 to the Josephson junction array chip 9, thereby achieving the cooling operation on the Josephson junction array chip 9 and ensuring that the Josephson junction array chip 9 works at a temperature of 4 K. In addition, the radiation shield plate 6 is fixed on the cold head 11 through multiple copper pillars. By fixing the radiation shield plate 6 through copper pillars, the magnetic shielding for the Josephson junction array chip 9 can be maintained, and the magnetic shielding creates an envelope of low magnetic flux regions around the Josephson junction array chip 9. In some embodiments, the multiple copper pillars may be arranged at intervals in the axial direction of the radiation shield plate 6, that is, the connection line of the multiple copper pillars is annular. The radiation shield plate 6 is fixed through six copper pillars. The heat shield aluminum oxide layer 8 can have a great heat shield effect and a certain magnetic shield effect and can well maintain the superconducting state of the Josephson junction array chip 9.

The clamp assembly 2 may include a clamp cover plate 21, a chip base 22, and a chip finger-jointed plate 23. The chip base 22 is fixed on the radiation shield plate 6. The chip finger-jointed plate 23 is fixed on the chip base 22. The chip finger-jointed plate 23 and the clamp cover plate 21 enclose and fix the Josephson junction array chip 9. To improve the enclosing and fixing effects of the chip finger-jointed plate 23 and the clamp cover plate 21, the clamp cover plate 21 may be designed as a plate member having a groove, and the size of the groove matches the size of the Josephson junction array chip 9. In addition, to avoid movement of the Josephson junction array chip 9 when the chip finger-jointed plate 23 and the clamp cover plate 21 enclose and fix the Josephson junction array chip 9, a slot may be provided on the chip finger-jointed plate 23, and an insert matching the position and size of the slot may be provided on the clamp cover plate 21. Through the cooperation between the slot and the insert, the fixing effect of the chip finger-jointed plate 23 and the clamp cover plate 21 can be achieved, and then the Josephson junction array chip 9 can be fixed, thereby limiting the movement of the Josephson junction array chip 9 in any direction.

In practical application scenarios, the chip finger-jointed plate 23 may include a flame-resistant substrate 231 and a copper-beryllium alloy finger-jointed plate 232. The flame-resistant substrate 231 is fixed on the chip base 22. The copper-beryllium alloy finger-jointed plate 232 is arranged on the flame-resistant substrate 231 and is connected to the Josephson junction array chip 9. The flame-resistant substrate 231 and the clamp cover plate 21 may be made of the same material. In some embodiments, the flame-resistant substrate 231 and the clamp cover plate 21 may be made of an FR-4 grade material, for example, an epoxy glass fiber board. In addition, the copper-beryllium alloy finger-jointed plate 232 is maintained at a controlled predetermined height to ensure that sufficient but limited force is applied to the Josephson junction array chip 9, thereby preventing the Josephson junction array chip 9 from damage caused by external forces during use.

During the operation of the Josephson junction array chip 9, heat is generated from the incident microwaves and any heat paths (for example, contacts with external sensor cables or copper wires). The conventional superconductor-insulator-superconductor (SIS) tunnel junction Josephson junction array chip 9 of 1 V consists of approximately 2,000 superconducting junctions (the Josephson junction array chip of 10 V has 20,000 Josephson junctions), and such a chip needs to be maintained below the critical temperature of the superconductor. When the temperature of the Josephson junction array chip 9 is above or near the critical temperature of niobium, the Josephson junction array chip 9 loses superconductivity. Therefore, the cooling rate of the Josephson junction array chip 9 should be faster than the rate of heat generation during operation. In this embodiment, temperature transfer can be achieved by establishing a physical contact between the copper-beryllium alloy finger-jointed plate 232 on the flame-resistant substrate 231 and a contact pad on the Josephson junction array chip 9, that is, cooling is performed through the path of cold head 11-chip base 22-flame-resistant substrate 231-copper-beryllium alloy finger-jointed plate 232-Josephson junction array chip 9, thereby improving the cooling rate of the Josephson junction array chip 9.

On the basis that the vacuum shield cover assembly 3 and the cryostat 1 cooperate to achieve the heat shielding, to avoid the damage on the shield effect by the connection wires of the Josephson junction array chip 9 to outside, the corresponding structure may be set up. In some embodiment, a connector 33 is fixed on the second vacuum shield cover 32, and the connector 33 is connected to the copper-beryllium alloy finger-jointed plate 232 through a copper wire. Through the connector 33, the Josephson junction array chip 9 may be connected to external devices, thereby fulfilling the corresponding functions. In addition, when the copper wire passes through the connector 33 and is connected to an external device, the copper wire is at room temperature, thereby providing a direct heat conduction path for the Josephson junction array chip 9 to room temperature. Therefore, the temperature gradient along the length of the wire can be reduced by setting a certain structure. In practical application scenarios, the cryostat 1 may further include a cryostat body 14. An end of the cryostat body 14 is provided with the cold head 11, and the first-stage chassis 12 and the second-stage chassis 13 are arranged apart in the axial direction of the cryostat body 14 on the sidewall of the cryostat body 14. The copper wire passes through the first-stage chassis 12 and is fixed on the cryostat body 14. The cold head 11, the first-stage chassis 12, and the second-stage chassis 13 are coaxially arranged on the cryostat body 14, thereby improving the symmetry of the heat shield, enabling an even distribution of the heat shielding effect of the heat shield, and improving the heat shielding. In addition to reducing the temperature gradient of the copper wire, the same treatment may be performed on other wires connected externally. In some embodiments, the sensor group 5 in this embodiment may include a temperature sensor and a magnetic field sensor. Both the temperature sensor and the magnetic field sensor are connected to the connector 33 through a sensor cable. The sensor cables pass through the first-stage chassis 12 and are fixed on the cryostat body 14. The temperature sensor and the magnetic field sensor can monitor the temperature and magnetic field of the Josephson junction array chip 9, thereby monitoring the state of the Josephson junction array chip 9 in real time. The temperature sensor is a silicon diode temperature sensor, and the magnetic field sensor is a Hall sensor.

Figure 4:
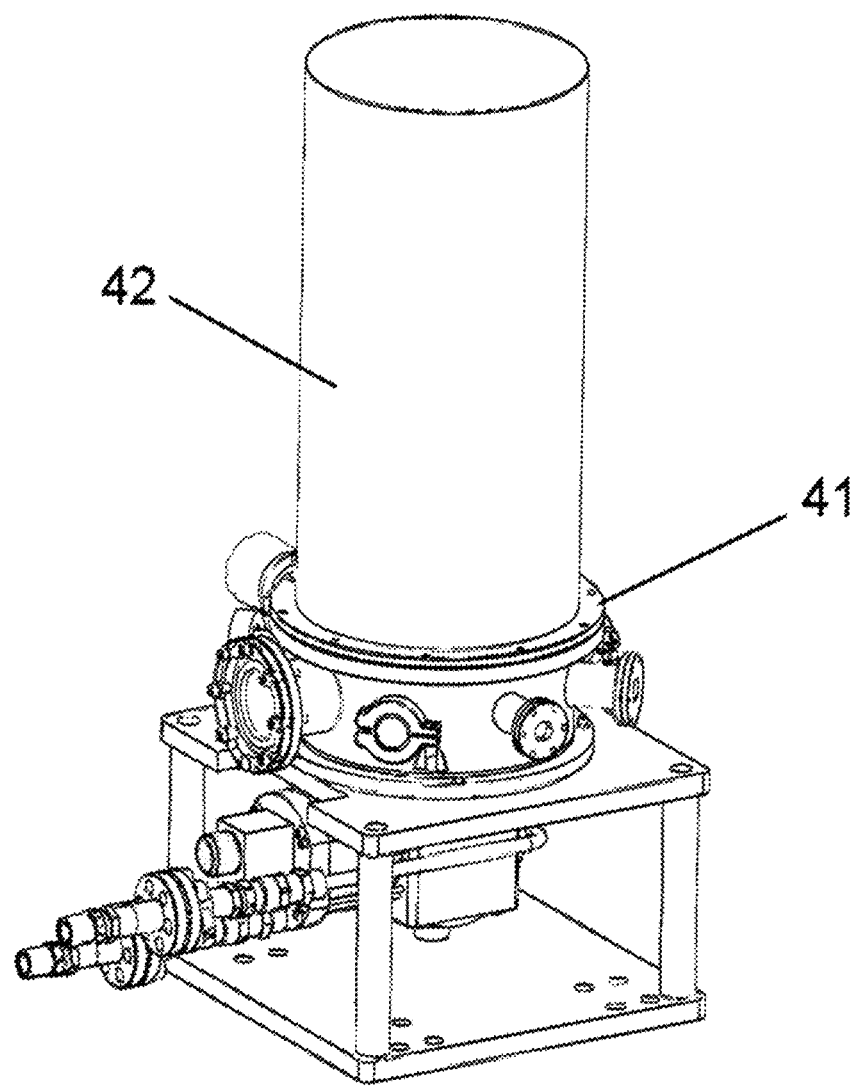
FIG. 4 is a structure view illustrating a vacuumizing assembly according to an embodiment of the present application.
Figure 5:
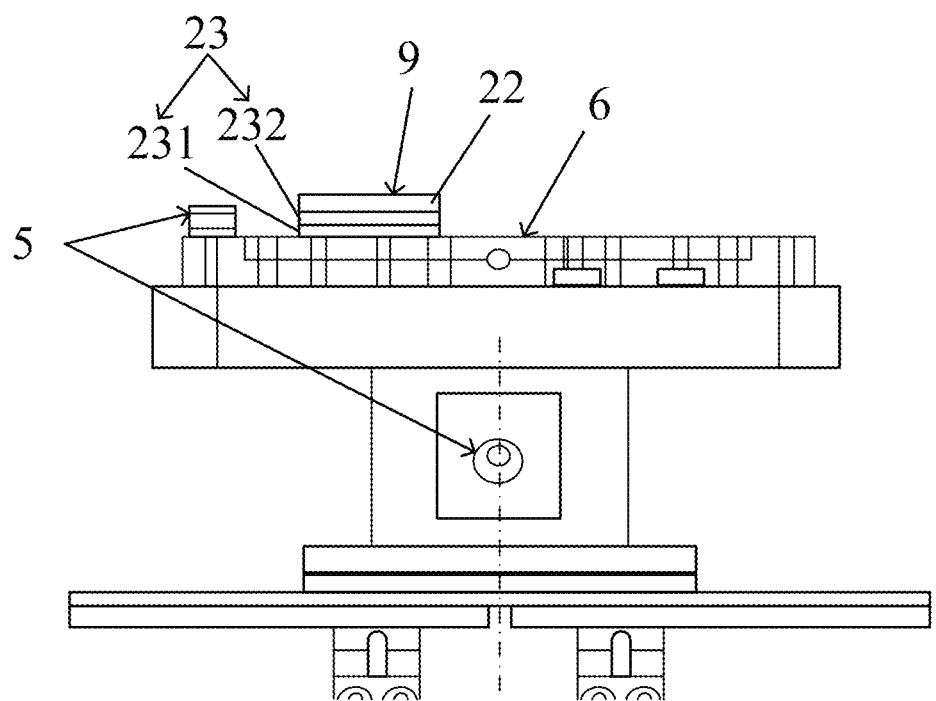
FIG. 5 is a partial section view illustrating a heat shield according to an embodiment of the present application.

In addition, as shown in FIG. 4, the first-stage chassis 12 and the second-stage chassis 13 of the present application are each provided with vacuum holes. The heat shield further includes a vacuumizing assembly. The vacuumizing assembly includes a vacuumizing base 41, a vacuumizing device, and a vacuumizing cover body 42. The cryostat 1 is fixed in the vacuumizing base 41. The vacuumizing cover body 42 is sleeved outside the second vacuum shield cover 32 and is detachably fixed to the vacuumizing base 41 in a sealing manner. The closed space formed by the vacuumizing base 41 and the vacuumizing cover body 42 may be vacuumized through the vacuumizing device, and due to the existence of the vacuum holes, the vacuum shield cover assembly may be vacuumized when the vacuumizing device performs vacuumizing, thereby avoiding the reduction in the heat shielding effect at the connection position due to direct connection between the vacuumizing device and the vacuum shield cover assembly.

In some embodiments, the vacuumizing device is an external device, and the heat shield may be vacuumized by a molecular pump through a vacuumizing connection valve 43.

The thickness of each vacuum shield cover (at least including the first vacuum shield cover and the second vacuum shield cover) is the same, and the coating thickness of each heat shield aluminum oxide layer 8 is the same. The thickness of each heat shield aluminum oxide layer 8 is determined in the following manner.

A temperature difference between the inside side of the heat shield aluminum oxide layer 8 and the outside side of the heat shield aluminum oxide layer 8 is obtained according to a physical parameter of the vacuumizing cover body, a physical parameter of the vacuum shield cover assembly, and an ambient temperature outside the heat shield, and the thickness of each heat shield aluminum oxide layer 8 is obtained according to the temperature difference between the inside side of the heat shield aluminum oxide layer 8 and the outside side of the heat shield aluminum oxide layer 8 and a physical parameter of the heat shield aluminum oxide layer 8.

In some embodiments, the physical parameter of the vacuumizing cover body includes a heat transfer coefficient of the outer side surface of the vacuumizing cover body and a thermal conductivity coefficient, a thickness, and a heat flux density of the vacuumizing cover body, the physical parameter of the vacuum shield cover assembly includes a thermal conductivity coefficient, a thickness, and a heat flux density, and the physical parameter of the heat shield aluminum oxide layer 8 includes the number of heat shield aluminum oxide layers 8, and a thermal conductivity coefficient and a heat flux density of the heat shield aluminum oxide layer 8.

In practical application scenarios, to improve the heat shielding effect, the vacuum shield cover assembly of the present application may include not only the first vacuum shield cover and the second vacuum shield cover but also multiple vacuum shield covers such as third vacuum shield covers. The coating thickness of the heat shield aluminum oxide layer 8 satisfies the following relation:

$$d_3 = \frac{\beta_3(T_1 - T_0)}{m\alpha_3} - \frac{\beta_3 \alpha_1}{\gamma m \alpha_3} - \frac{\beta_3}{m\alpha_3}\left(\frac{d_1 \alpha_1}{\beta_1} + \frac{nd_2 \alpha_2}{\beta_2}\right).$$

In the above formula, $T_1$ is the ambient temperature outside the heat shield, $T_0$ is a critical temperature of the Josephson junction array chip 9, $d_1$ is the thickness of the vacuumizing cover body, $d_2$ is the thickness of a single vacuum shield cover, that is, the thickness of the first vacuum shield cover or the thickness of the second vacuum shield cover, $d_3$ is the thickness of the heat shield aluminum oxide layer 8, n and m are the number of vacuum shield covers and the number of heat shield aluminum oxide layers 8, respectively, $\alpha_1$, $\alpha_2$, and $\alpha_3$ are the heat flux density of the vacuumizing cover body, the heat flux density of the vacuum shield cover assembly, and the heat flux density of the heat shield aluminum oxide layer 8, respectively, $\beta_1$, $\beta_2$, and $\beta_3$ are the thermal conductivity coefficient of the vacuumizing cover body, the thermal conductivity coefficient of the vacuum shield cover assembly, and the thermal conductivity coefficient of the heat shield aluminum oxide layer 8, respectively, and $\gamma$ is the heat transfer coefficient of the outer side surface of the vacuumizing cover body. The heat transfer coefficient may be calculated by measuring the vacuumizing cover body at the ambient temperature.

In addition, the vacuum shield cover assembly of the present application includes the first vacuum shield cover and the second vacuum shield cover that are made of the same material and have the same thickness. In addition, the first vacuum shield cover and/or the second vacuum shield cover are coated with at least one heat shield aluminum oxide layer 8 which has a low thermal conductivity. A predetermined number of heat shield aluminum oxide layers 8 are coated on the heat shield, and the thickness of each heat shield aluminum oxide layer 8 is determined in the following manner.

A first temperature difference between the ambient temperature and the outer side surface of the vacuumizing cover body is obtained according to the heat transfer coefficient of the outer side surface of the vacuumizing cover body and the heat flux density of the vacuumizing cover body.

A second temperature difference between the outer side surface of the vacuumizing cover body and the inner side surface of the vacuumizing cover body is obtained according to the thermal conductivity coefficient, the thickness, and the heat flux density of the vacuumizing cover body.

A third temperature difference between the outer side surface of the first vacuum shield cover and the inner side surface of the first vacuum shield cover and a fourth temperature difference between the outer side surface of the second vacuum shield cover and the inner side surface of the second vacuum shield cover are obtained according to the thermal conductivity coefficient, the thickness, and the heat flux density of the first vacuum shield cover and the thermal conductivity coefficient, the thickness, and the heat flux density of the second vacuum shield cover.

A fifth temperature difference between the outer side surface of the heat shield aluminum oxide layer 8 and the inner side surface of the heat shield aluminum oxide layer 8 is obtained according to the first temperature difference, the second temperature difference, the third temperature difference, and the fourth temperature difference.

The thickness of each heat shield aluminum oxide layer 8 is obtained according to the fifth temperature difference between the outer side surface of the heat shield aluminum oxide layer 8 and the inner side surface of the heat shield aluminum oxide layer 8 and the number of the heat shield aluminum oxide layers 8, and the thermal conductivity coefficient and the heat flux density of the heat shield aluminum oxide layer 8.

Accordingly, the thickness of each heat shield aluminum oxide layer 8 satisfies the following relation:

$$d_3 = \frac{\beta_3(T_1 - T_0)}{m\alpha_3} - \frac{\beta_3 \alpha_1}{\gamma m \alpha_3} - \frac{\beta_3}{m\alpha_3}\left(\frac{d_1 \alpha_1}{\beta_1} + \frac{2d_2 \alpha_2}{\beta_2}\right).$$

In the formula, $T_1$ is the ambient temperature outside the heat shield, $T_0$ is the critical temperature of the Josephson junction array chip 9, $d_1$ is the thickness of the vacuumizing cover body 42, $d_2$ is the thickness of the first vacuum shield cover or the thickness of the second vacuum shield cover, $d_3$ is the thickness of the heat shield aluminum oxide layer 8, m is the number of heat shield aluminum oxide layers 8, $\alpha_1$, $\alpha_2$, and $\alpha_3$ are the heat flux density of the vacuumizing cover body, the heat flux density of the vacuum shield cover assembly, and the heat flux density of the heat shield aluminum oxide layer 8, respectively, $\beta_1$, $\beta_2$, and $\beta_3$ are the thermal conductivity coefficient of the vacuumizing cover body, the thermal conductivity coefficient of the vacuum shield cover assembly, and the thermal conductivity coefficient of the heat shield aluminum oxide layer 8, respectively, and $\gamma$ is the heat transfer coefficient of the outer side surface of the vacuumizing cover body.

Through the thickness of the heat shield aluminum oxide layer 8 calculated above, the heat shielding for the Josephson junction array chip 9 can be achieved with the cooperation between the vacuum shield cover assembly and the vacuumizing cover body, thereby avoiding the influence of the external ambient temperature on the Josephson junction array chip 9 and ensuring that the temperature of the Josephson junction array chip 9 does not exceed the critical temperature.

Under the premise of achieving the heat shielding, the heat shield also needs to transmit microwave power to the Josephson junction array chip 9 to excite the Josephson junction array chip 9. In some embodiments, the heat shield may further include a waveguide assembly 7. The waveguide assembly 7 is fixed to the flame-resistant substrate 231 and is connected to the antenna of the Josephson junction array chip 9 through the copper-beryllium alloy finger-jointed plate 232. In the practical application process, to avoid vast heat loads generated on the surface of the Josephson junction array chip 9 due to the waveguide assembly 7, the structure of the waveguide assembly 7 may be set. For example, the waveguide assembly 7 in this embodiment may include a rigid waveguide 71 and a flexible waveguide 72. The rigid waveguide 71 is located in the first vacuum shield cover 31 and is fixed to the flame-resistant substrate 231. One end of the flexible waveguide 72 is connected to the rigid waveguide 71, and the other end passes through the first-stage chassis 12 and extends outside the second vacuum shield cover 32. The rigid waveguide 71 can improve the fixing stability between the waveguide assembly 7 and the flame-resistant substrate 231 and improve the connection stability between the waveguide assembly 7 and the copper-beryllium alloy finger-jointed plate 232. In some embodiments, the rigid waveguide 71 is made of WR-12 metal, such a metal has excellent electrical and thermal conductivity and can withstand high-frequency and high-power signal transmission. The flexible waveguide 72 is made of a thermodielectric material. In this embodiment, by dividing the waveguide assembly 7 into the rigid waveguide 71 and the flexible waveguide 72, the heat conduction path from the outside of the vacuum shield cover assembly 3 to the flame-resistant substrate 231 can be separated, thereby isolating the inside of the vacuum shield cover assembly 3 from the external environment. The waveguide assembly 7 may also be in thermal contact with the chip base 22 through the flame-resistant substrate 231 and thus may be cooled, thereby avoiding vast heat loads generated on the mounting surface of the Josephson junction array chip 9.

The heat shield may further include a current supply assembly and a voltage detection assembly. The current supply assembly is connected to the Josephson junction array chip 9 through the connector 33 and a copper wire to supply a bias current to the Josephson junction array chip 9, thereby implementing the normal operation of the Josephson junction array chip 9. The voltage detection assembly is connected to the Josephson junction array chip 9 through the connector 33 and a copper wire to detect the voltage of the Josephson junction array chip 9, thereby monitoring the operation state of the Josephson junction array chip 9.

The present application further provides a Josephson junction array chip system with heat shielding.

The Josephson junction array chip system may include the heat shield described above and the Josephson junction array chip 9.

The Josephson junction array chip 9 is fixed in the clamp assembly 2.

After the Josephson junction array chip 9 is fixed in the clamp assembly 2 of the heat shield, the temperature of the surface of the first vacuum shield cover 31 is 40 K to 46 K when the Josephson junction array chip 9 operates. The operating temperature of the Josephson junction array chip 9 is 4 K.

After the structures for heat convection and heat conduction are determined, the heat radiation load needs to be reduced. Different from conduction heat transfer or convection heat transfer, radiation heat transfer does not require the presence of any medium or substance. For the Josephson junction array chip 9 with the heat shielding, the operating temperature of the Josephson junction array chip 9 is close to 4 K, nearly 290 K lower than the room temperature. Radiation heating is a quartic function of a temperature difference, as shown below, and it is an important source of the heat load of the system:

$$q \propto \sigma(T_2^4 - T_3^4).$$

In the above formula, q is the net rate of radiation transfer, σ is the Stefan-Boltzmann constant, and $T_2$ and $T_3$ are the ambient temperature (the room temperature) and the operating temperature of the Josephson junction array chip 9, respectively. For a system which is highly sensitive to temperature, the temperature difference of 290 K may destabilize the system in the case of radiation heating. Therefore, the Josephson junction array chip 9 of the present application adopts a radiation shield structure (a mating structure of the vacuum shield cover assembly, the first-stage chassis, the second-stage chassis, and the radiation shield plate 6) to reduce the net radiation transfer. The radiation shield plate 6 may be securely bolted on the first-stage chassis of the cryostat. Through a second-stage thermally fixed radiation shield structure (a mating structure of the second vacuum shield cover and the second-stage chassis), the operating temperature of the shield surface is 45 K. In some embodiments, when the chip base 22 working at 4 K and the cold head of the cryostat are completely exposed to the inner surface of the vacuum shield cover assembly which is maintained at the room temperature, the exposure temperature of the chip base 22 is reduced from 295 K to 45 K, and the heat load is reduced by a factor of more than 1800. After the radiation shield structure is completed and is thermally fixed at the second stage, the temperature distribution on the shield surface may be measured using a temperature sensor. The temperature at different positions on the radiation shield is measured, and the surface temperature was verified to be 42 K±1 K. Finally, through a first-stage thermally fixed radiation shield structure, the operating temperature of the Josephson junction array chip 9 may be close to 4 K.

Compared with the related art, the present application at least has the following advantages.

(1) The Josephson junction array chip is fixed on the radiation shield plate through the clamp assembly, thereby avoiding the influence on the heat shielding effect because the position of the Josephson junction array chip is shifted when the Josephson junction array chip moves during the heat shield process. Through the cooperation between the radiation shield plate and the vacuum shield cover assembly, not only the Josephson junction array chip can be fixed, but also a certain heat shielding effect can be obtained. On the basis of the cooperation among the first vacuum shield cover, the second vacuum shield cover, the heat shield aluminum oxide layer, the first-stage chassis, and the second-stage chassis, the clamp assembly works with the radiation shield plate to achieve the heat shielding for the Josephson junction array chip, thereby ensuring that the heat shielding effect on the Josephson junction array chip can continuously satisfy the predetermined requirements. In addition, with the cooling effect of the cold head on the Josephson junction array chip and the cooperation of the corresponding structures for shielding the Josephson junction array chip from heat, the Josephson junction array chip can be continuously maintained at the optimal operating temperature (4 K).

(2) By setting the chip finger-jointed plate and the connector, the Josephson junction array chip can be connected to equipment or devices outside the heat shield, thereby ensuring the operating state of the Josephson junction array chip. In addition, by setting the flame-resistant substrate and the copper-beryllium alloy finger-jointed plate and limiting the position relationship between the flame-resistant substrate and the copper-beryllium alloy finger-jointed plate, the heat conduction effect of the chip finger-jointed plate can be reduced.

(3) By fixing the copper wire between the chip finger-jointed plate and the connector onto the cryostat body, the temperature of the copper wire can be controlled, thereby preventing the temperature of the Josephson junction array chip from being affected by the temperature outside the vacuum shield cover assembly transferred to the Josephson junction array chip through the connector, the copper wire, and the chip finger-jointed plate after the Josephson junction array chip is connected to the equipment or devices outside the heat shield.

(4) By connecting the rigid waveguide and the flexible waveguide to the Josephson junction array chip, the heat conduction path from the outside of the vacuum shield cover assembly to the flame-resistant substrate can be separated, thereby isolating the inside of the vacuum shield cover assembly from the external environment.

(5) By setting the vacuumizing base, the vacuumizing device, and the vacuumizing cover body, the shielding effect of the heat shield can be improved to a certain extent, and the vacuum shield cover assembly can be vacuumized, thereby avoiding the reduction in the heat shielding effect at the connection position caused by the direct connection of the vacuumizing device to the vacuum shield cover assembly.

What is claimed is:

1. A heat shield, comprising a cryostat, a sensor group, a radiation shield plate, a waveguide assembly, a clamp assembly, and a vacuum shield cover assembly; wherein
the cryostat comprises a cold head, a first-stage chassis, and a second-stage chassis that are arranged at intervals in sequence;
the vacuum shield cover assembly comprises a first vacuum shield cover and a second vacuum shield cover; the second vacuum shield cover is fixed to the second-stage chassis, the first vacuum shield cover is fixed to the first-stage chassis and is located in the second vacuum shield cover, and the cold head is located in the first vacuum shield cover; the vacuum shield cover assembly further comprises a heat shield aluminum oxide layer, and the heat shield aluminum oxide layer is coated on at least one of a surface of the first vacuum shield cover or a surface of the second vacuum shield cover;
the radiation shield plate is fixed on the cold head;
the waveguide assembly is configured to be connected to an antenna of a Josephson junction array chip, the waveguide assembly comprises a rigid waveguide and a flexible waveguide connected to the rigid waveguide, the rigid waveguide is located in the first vacuum shield cover, and the flexible waveguide extends outside the second vacuum shield cover;
the clamp assembly is arranged on the radiation shield plate and is configured to fix the Josephson junction array chip; and
the sensor group is arranged on the radiation shield plate and is configured to be adjacent to the Josephson junction array chip.

2. The heat shield according to claim 1, wherein the cryostat further comprises a cryostat body, an end of the cryostat body is connected to the cold head, and the first-stage chassis and the second-stage chassis are arranged apart in an axial direction of the cryostat body on a sidewall of the cryostat body.

3. The heat shield according to claim 2, wherein the clamp assembly comprises a clamp cover plate, a chip base, and a chip finger-jointed plate, the chip base is fixed on the radiation shield plate, the chip finger-jointed plate is fixed on the chip base, and the chip finger-jointed plate and the clamp cover plate are configured to enclose and fix the Josephson junction array chip.

4. The heat shield according to claim 3, wherein the chip finger-jointed plate comprises a flame-resistant substrate and a copper-beryllium alloy finger-jointed plate, the flame-resistant substrate is fixed on the chip base, and the copper-beryllium alloy finger-jointed plate is arranged on the flame-resistant substrate and is configured to be connected to the Josephson junction array chip.

5. The heat shield according to claim 4, wherein a connector is fixed on the second vacuum shield cover, and the connector is connected to the copper-beryllium alloy finger-jointed plate through a copper wire; and
the copper wire passes through the first-stage chassis and is fixed on the cryostat body.

6. The heat shield according to claim 5, wherein the rigid waveguide is fixed to the flame-resistant substrate and is configured to be connected to the antenna of the Josephson junction array chip through the copper-beryllium alloy finger-jointed plate, a first end of the flexible waveguide is connected to the rigid waveguide, and a second end of the flexible waveguide passes through the first-stage chassis and extends outside the second vacuum shield cover.

7. The heat shield according to claim 1, further comprising a vacuumizing base, a vacuumizing device, and a vacuumizing cover body, wherein the cryostat is fixed in the vacuumizing base, and the vacuumizing cover body is sleeved outside the second vacuum shield cover and is detachably fixed to the vacuumizing base in a sealing manner;
the first-stage chassis and the second-stage chassis are each provided with a plurality of vacuum holes therethrough to enable an internal shield space of the first vacuum shield cover and an internal shield space of the second vacuum shield cover to communicate with an internal space of the vacuumizing cover body, and the vacuumizing device is fixedly connected to the vacuumizing base to vacuumize internal shield spaces and the internal space.

8. The heat shield according to claim 7, wherein the first vacuum shield cover and the second vacuum shield cover have a same material and a same thickness, and the heat shield aluminum oxide layer coated on the first vacuum shield cover and the heat shield aluminum oxide layer coated on the second vacuum shield cover have a same thickness,
wherein the thickness of the heat shield aluminum oxide layer is determined by the following formula:

$$d_3 = \frac{\beta_3(T_1 - T_0)}{m\alpha_3} - \frac{\beta_3 \alpha_1}{\gamma m \alpha_3} - \frac{\beta_3}{m\alpha_3}\left(\frac{d_1 \alpha_1}{\beta_1} + \frac{2d_2 \alpha_2}{\beta_2}\right);$$

wherein $T_1$ is the ambient temperature outside the heat shield, $T_0$ is a critical temperature of the Josephson junction array chip, $d_1$ is a thickness of the vacuumizing cover body, $d_2$ is a thickness of the first vacuum shield cover or a thickness of the second vacuum shield cover, $d_3$ is the thickness of the heat shield aluminum oxide layer, m is a number of heat shield aluminum oxide layers, $\alpha_1$, $\alpha_2$, and $\alpha_3$ are a heat flux density of the vacuumizing cover body, a heat flux density of the vacuum shield cover assembly, and a heat flux density of the heat shield aluminum oxide layer, respectively, $\beta_1$, $\beta_2$, and $\beta_3$ are a thermal conductivity coefficient of the vacuumizing cover body, a thermal conductivity coefficient of the vacuum shield cover assembly, and a thermal conductivity coefficient of the heat shield aluminum oxide layer, respectively, and $\gamma$ is a heat transfer coefficient of an outer side surface of the vacuumizing cover body.

9. The heat shield according to claim 2, further comprising a vacuumizing base, a vacuumizing device, and a vacuumizing cover body, wherein the cryostat is fixed in the vacuumizing base, and the vacuumizing cover body is sleeved outside the second vacuum shield cover and is detachably fixed to the vacuumizing base in a sealing manner;

the first-stage chassis and the second-stage chassis are each provided with a plurality of vacuum holes therethrough to enable an internal shield space of the first vacuum shield cover and an internal shield space of the second vacuum shield cover to communicate with an internal space of the vacuumizing cover body, and the vacuumizing device is fixedly connected to the vacuumizing base to vacuumize internal shield spaces and the internal space.

10. The heat shield according to claim 3, further comprising a vacuumizing base, a vacuumizing device, and a vacuumizing cover body, wherein the cryostat is fixed in the vacuumizing base, and the vacuumizing cover body is sleeved outside the second vacuum shield cover and is detachably fixed to the vacuumizing base in a sealing manner;

the first-stage chassis and the second-stage chassis are each provided with a plurality of vacuum holes therethrough to enable an internal shield space of the first vacuum shield cover and an internal shield space of the second vacuum shield cover to communicate with an internal space of the vacuumizing cover body, and the vacuumizing device is fixedly connected to the vacuumizing base to vacuumize internal shield spaces and the internal space.

11. A Josephson junction array chip system, comprising a heat shield and a Josephson junction array chip, wherein the Josephson junction array chip is fixedly arranged in a clamp assembly of the heat shield, and the heat shield comprises a cryostat, a sensor group, a radiation shield plate, a waveguide assembly, the clamp assembly, and a vacuum shield cover assembly; wherein the cryostat comprises a cold head, a first-stage chassis, and a second-stage chassis that are arranged at intervals in sequence; the vacuum shield cover assembly comprises a first vacuum shield cover and a second vacuum shield cover; the second vacuum shield cover is fixed to the second-stage chassis, the first vacuum shield cover is fixed to the first-stage chassis and is located in the second vacuum shield cover, and the cold head is located in the first vacuum shield cover; the vacuum shield cover assembly further comprises a heat shield aluminum oxide layer, and the heat shield aluminum oxide layer is coated on at least one of a surface of the first vacuum shield cover or a surface of the second vacuum shield cover; the radiation shield plate is fixed on the cold head; the waveguide assembly is configured to be connected to an antenna of the Josephson junction array chip, the waveguide assembly comprises a rigid waveguide and a flexible waveguide connected to the rigid waveguide, the rigid waveguide is located in the first vacuum shield cover, and the flexible waveguide extends outside the second vacuum shield cover; the clamp assembly is arranged on the radiation shield plate and is configured to fix the Josephson junction array chip; and the sensor group is arranged on the radiation shield plate and is configured to be adjacent to the Josephson junction array chip.

12. The Josephson junction array chip system according to claim 11, wherein the cryostat further comprises a cryostat body, an end of the cryostat body is connected to the cold head, and the first-stage chassis and the second-stage chassis are arranged apart in an axial direction of the cryostat body on a sidewall of the cryostat body.

13. The Josephson junction array chip system according to claim 12, wherein the clamp assembly comprises a clamp cover plate, a chip base, and a chip finger-jointed plate, the chip base is fixed on the radiation shield plate, the chip finger-jointed plate is fixed on the chip base, and the chip finger-jointed plate and the clamp cover plate are configured to enclose and fix the Josephson junction array chip.

14. The Josephson junction array chip system according to claim 13, wherein the chip finger-jointed plate comprises a flame-resistant substrate and a copper-beryllium alloy finger-jointed plate, the flame-resistant substrate is fixed on the chip base, and the copper-beryllium alloy finger-jointed plate is arranged on the flame-resistant substrate and is configured to be connected to the Josephson junction array chip.

15. The Josephson junction array chip system according to claim 14, wherein a connector is fixed on the second vacuum shield cover, and the connector is connected to the copper-beryllium alloy finger-jointed plate through a copper wire; and the copper wire passes through the first-stage chassis and is fixed on the cryostat body.

16. The Josephson junction array chip system according to claim 15, wherein the rigid waveguide is fixed to the flame-resistant substrate and is configured to be connected to the antenna of the Josephson junction array chip through the copper-beryllium alloy finger-jointed plate, a first end of the flexible waveguide is connected to the rigid waveguide, and a second end of the flexible waveguide passes through the first-stage chassis and extends outside the second vacuum shield cover.

17. The Josephson junction array chip system according to claim 11, wherein the heat shield further comprises a vacuumizing base, a vacuumizing device, and a vacuumizing cover body, wherein the cryostat is fixed in the vacuumizing base, and the vacuumizing cover body is sleeved outside the second vacuum shield cover and is detachably fixed to the vacuumizing base in a sealing manner;

the first-stage chassis and the second-stage chassis are each provided with a plurality of vacuum holes therethrough to enable an internal shield space of the first vacuum shield cover and an internal shield space of the second vacuum shield cover to communicate with an internal space of the vacuumizing cover body, and the vacuumizing device is fixedly connected to the vacuumizing base to vacuumize internal shield spaces and the internal space.

18. The Josephson junction array chip system according to claim 17, wherein the first vacuum shield cover and the second vacuum shield cover have a same material and a same thickness, and the heat shield aluminum oxide layer coated on the first vacuum shield cover and the heat shield aluminum oxide layer coated on the second vacuum shield cover have a same thickness, wherein the thickness of the heat shield aluminum oxide layer is determined by the following formula:

$$d_3 = \frac{\beta_3(T_1 - T_0)}{m\alpha_3} - \frac{\beta_3\alpha_1}{\gamma m\alpha_3} - \frac{\beta_3}{m\alpha_3}\left(\frac{d_1\alpha_1}{\beta_1} + \frac{2d_2\alpha_2}{\beta_2}\right);$$

wherein, $T_1$ is the ambient temperature outside the heat shield, $T_0$ is a critical temperature of the Josephson junction array chip, $d_1$ is a thickness of the vacuumizing cover body, $d_2$ is a thickness of the first vacuum shield cover or a thickness of the second vacuum shield cover, $d_3$ is the thickness of the heat shield aluminum oxide layer, m is a number of heat shield aluminum oxide layers, $\alpha_1$, $\alpha_2$, and $\alpha_3$ are a heat flux density of the vacuumizing cover body, a heat flux density of the vacuum shield cover assembly, and a heat flux density of the heat shield aluminum oxide layer, respectively, $\beta_1$, $\beta_2$, and $\beta_3$ are a thermal conductivity coefficient of the vacuumizing cover body, a thermal conductivity coefficient of the vacuum shield cover assembly, and a thermal conductivity coefficient of the heat shield aluminum oxide layer, respectively, and $\gamma$ is a heat transfer coefficient of an outer side surface of the vacuumizing cover body.

* * * * *